(12) United States Patent
Nam et al.

(10) Patent No.: US 7,497,966 B2
(45) Date of Patent: Mar. 3, 2009

(54) CHEMICAL MECHANICAL POLISHING SLURRY COMPOSITION FOR SHALLOW TRENCH ISOLATION PROCESS OF SEMICONDUCTOR

(75) Inventors: Ho-Seong Nam, Yuseong-Ku (KR); Jin-Seo Lee, Yuseong-Ku (KR); Gui-Ryong Ahn, Seo-Gu (KR)

(73) Assignee: Hanwha Chemical Corporation, Seoul (KR)

( * ) Notice: Subject to any disclaimer, the term of this patent is extended or adjusted under 35 U.S.C. 154(b) by 95 days.

(21) Appl. No.: 10/594,537

(22) PCT Filed: Mar. 24, 2005

(86) PCT No.: PCT/KR2005/000859

§ 371 (c)(1),
(2), (4) Date: Sep. 27, 2006

(87) PCT Pub. No.: WO2006/004258

PCT Pub. Date: Jan. 12, 2006

(65) Prior Publication Data

US 2007/0220813 A1    Sep. 27, 2007

(30) Foreign Application Priority Data

Mar. 29, 2004   (KR) .................. 10-2004-0021258

(51) Int. Cl.
*C09K 13/00* (2006.01)
(52) U.S. Cl. ..................................... 252/79.1; 252/79.4
(58) Field of Classification Search ................. 252/79.1
See application file for complete search history.

(56) References Cited

U.S. PATENT DOCUMENTS

| 5,480,476 | A | 1/1996 | Cook et al. |
| 5,738,800 | A | 4/1998 | Hosali et al. |
| 5,759,917 | A | 6/1998 | Grover et al. |
| 6,117,783 | A | 9/2000 | Small et al. |
| 6,174,454 | B1 * | 1/2001 | Tsai et al. ................... 252/79.4 |
| 6,313,039 | B1 | 11/2001 | Small et al. |
| 6,447,695 | B1 * | 9/2002 | Motonari et al. ........... 252/79.1 |
| 6,458,291 | B2 | 10/2002 | Carlson |
| 6,468,910 | B1 | 10/2002 | Srinivasan et al. |
| 6,491,843 | B1 | 12/2002 | Srinivasan et al. |
| 6,544,892 | B2 | 4/2003 | Srinivasan et al. |
| 6,783,434 | B1 * | 8/2004 | Akahori et al. ............... 451/41 |

FOREIGN PATENT DOCUMENTS

KR    20010062282    7/2001

* cited by examiner

*Primary Examiner*—Keith D Hendricks
*Assistant Examiner*—Patricia A George
(74) *Attorney, Agent, or Firm*—The Webb Law Firm

(57) ABSTRACT

The present invention is related to a chemical-mechanical polishing slurry for shallow trench isolation, more concretely, to a chemical-mechanical polishing slurry comprising an aqueous abrasive solution comprised of deionized water, polishing particles, and a polishing particle dispersant; and an aqueous additive solution comprised of a carboxylic acid polymer compound, a nitrogen-containing organic cyclic compound, and an amine-group compound. The removal selectivity of the slurry may be improved by significantly lowering the speed of polishing of nitride film by adding a nitrogen-containing organic cyclic compound to an acrylic acid polymer compound, and by increasing the speed of removal of silicon oxide film by adding an amine-group compound, which is an accelerator of hydrolysis of silicon oxide film.

10 Claims, No Drawings

US 7,497,966 B2

CHEMICAL MECHANICAL POLISHING SLURRY COMPOSITION FOR SHALLOW TRENCH ISOLATION PROCESS OF SEMICONDUCTOR

TECHNICAL FIELD

An object of the present invention is to provide with chemical-mechanical polishing slurries that are useful for selectively removing silicon oxide films in chemical-mechanical polishing slurries for the shallow trench isolation process of devices.

BACKGROUND ART

During several years recently, the reduction in the size and high-integration of devices have been accelerated as semiconductor technologies have been developed. In case of memory semiconductors, since the position of a capacitor is changed from CUB (Capacitor Under Bit Line) to COB (Capacitor Over Bit Line) and the form of a capacitor is changed to a cylindrical structure in order to increase the capacity of a capacitor as the degree of integration is increased gradually, and the processes of layering are accompanied successively as multi-layered circuits are used in logic chips, the surface of a wafer is layered after those processes, which brings about many problems in subsequent processes. In order to remove such problems, the Chemical-Mechanical Polishing (CMP) process is introduced so that a wafer is planarized.

One of the processes in which the chemical-mechanical polishing process is used is shallow trench isolation, which is a method of isolation of active elements in the manufacture of semi-conductor devices. This is a method of securing desired active elements through mounting of a silicon oxide film and silicon nitride on silicon, formation of a trench to silicon by etching, gap-filling of the silicon oxide film, and planarization of them by chemical-mechanical polishing. However, the silicon oxide film and silicon nitride film are exposed as the trench is gap-filled with the silicon oxide film and polished chemically and mechanically. The amount of removal of the silicon nitride film will be the greatest if a slurry having a low removal selectivity is used, where a removal selectivity refers to the ratio of the speed of removal of silicon oxide film to that of silicon nitride film. The loss of a silicon nitride film brings about the change in thickness of a field oxide film and reduces an over-polishing margin.

According to U.S. Pat. No. 5,738,800 of Hosali et al., a CMP slurry is comprised of an aqueous medium, abrasive particles, a surfactant, and a compound which complexes with the silicon oxide film and silicon nitride film and has two or more functional groups each having a dissociable proton. According to the above patent, it is deemed that the surfactant used along with the complex in the CMP slurry has an affect on the speed of removing silicon nitride layer from the surface of the complex although it does not perform usual functions of surfactants (i.e., stabilization of corpuscular dispersed bodies, etc.). Chemical interactions between the surfactant and complex are not illustrated. The slurry composition according to the above patent shows more superior selectivity to those of the conventional CMP slurries, but only within a narrow pH range (of about 6 to 7).

Disclosed in U.S. Pat. No. 5,759,917 of Grover et al. is a CMP slurry for selectively polishing a silicon oxide overfill in preference to a silicon nitride film layer during the manufacture of integrated circuits and semiconductors. According to the above patent, a CMP slurry is comprised of carboxylic acid, a salt, and a soluble cerium compound at a pH within the range of about 3 to 11. It is possible to obtain a silicon nitride to oxide removal selectivity of about 5 to 100, but the highest selectivity reported in preferred embodiments is 34.89, and only a selectivity of less than 20 is obtained in most of preferred embodiments materially.

Disclosed in Korean Patent Application No. 2000-074748 is an aqueous slurry comprised of an organic compound (amino acid) having both of a carboxylic acid functional group and the second functional group selected from amine and halogen compounds and abrasive particles in order to be used for removing selectively a silicon oxide film from the surface of the product in preference to a silicon nitride film through chemical-mechanical polishing. However, the selectivity of this slurry tends to be lowered.

DISCLOSURE OF INVENTION

Technical Problem

Accordingly, the present invention is to provide with a polishing slurry comprised of an aqueous polishing solution comprised of deionized water, polishing particles, and a polishing particle dispersant; a polycarboxylic acid salt as an aqueous additive for increasing the removal selectivity; a carboxylic acid polymer-group compound; a nitrogen-containing organic cyclic compound; an amine-group additive; and further, a pH controlling agent, etc.

The present invention is also to provide with a chemical-mechanical polishing slurry having a high removal selectivity and a superior degree of planarization, which is applicable to shallow trench isolation by using the slurry described in the above.

Technical Solution

The present invention is illustrated in more detail below:

As described in the above, the chemical-mechanical polishing slurry according to the present invention is comprised of an aqueous abrasive comprised of deionized water, polishing particles, a polishing particle dispersant; and an aqueous additive for increasing the removal selectivity comprised of a carboxylic acid polymer-group compound as an additive showing it is acidic, a nitrogen-containing organic cyclic compound as a basic additive, and an amine-group compound. Besides the above, hydrochloric acid, sulfuric acid, nitric acid, sodium hydroxide, a basic solution of ammonia, etc. may be used for a pH controlling agent.

Polishing particles of the aqueous abrasive of the present invention perform the function of mechanical polishing. The above polishing particles used during slurring may include one or more arbitrary mixtures among various polishing particles used commonly for a CMP slurry. Polishing particles used generally include alumina, ceria, copper oxide, tin oxide, nickel oxide, manganese oxide, silica, silicon carboxide, silicon nitride, titania, titanium carboxide, tungsten oxide, yttria, zirconia, and the combination of the above; and preferred polishing particles of the present invention are one or more compounds selected from the group comprising ceria, alumina, silica, and titania.

It is preferable that the average size of the above polishing particles is in the range of about 0.02 to about 1 micrometer, and the maximum size is about 10 micrometers. If the particle size is too small, the speed of polishing of the slurry may be too slow to be accepted; and if the particle size is too large, there may occur scratching that can not be allowed on the surface of the particles to be polished, and the solution may be separated into two layers as the particles are coagulated and sedimented.

Polishing particles are mixed with deionized water from which most of impurities such as ions, corpuscles, organic materials, etc. is removed, and it is preferable that deionization shows a resistance rate of about 5~18 □□. The amount of polishing particles to be mixed with deionized water may be 0.01 to 30 weight %, preferably, 0.5 to 10 weight %.

A surfactant is used for the dispersant for the dispersion of polishing particles. Examples of surfactants include polymer dispersants, aqueous anionic surfactants, aqueous non-ionic surfactants, aqueous cationic surfactants, etc. It is preferable to adjust the amount of an alkali metal such as sodium (Na), potassium (K), etc. and of a halogen ion to be less than 10 ppm in a surfactant. A polymer dispersant, which is a dispersant used in the present invention, is a polycarboxylic acid ammonium salt. One or more compounds selected from polyacrylic acid ammonium salt, polymethacrylic acid ammonium salt, polyacrylic acid amine salt, polymethacrylic acid amine salt, poly(ethylene-co-acrylic acid) ammonium salt, poly(ethylene-co-acrylic acid) amine salt, poly(ethylene-co-methacrylic acid) ammonium salt, and poly(ethylene-co-methacrylic acid) amine salt are used for polymer dispersants. The amount of a surfactant is 0.1~10 weight %, preferably, 0.5~8 weight %.

An aqueous additive assumes the role of suppressing selectively the speed of polishing by stopping accessing of polishing particles by inducing the steric hindrance effect as it is bound to the surface of polishing of the silicon nitride film. For instance, it is possible to reduce the speed of polishing of the nitride film layer by adsorbing an additive to the nitride film layer by using an anionic additive since the surface charge of an oxide film is negative and that of a nitride film is positive at a pH of 6~8. The above additive composition is selectively comprised of polycarboxylic acid polymers, that are acidic, nitrogen-containing organic cyclic compounds, that are basic, and amine-group compounds.

The above-described polycarboxylic acid polymers are poly(meth)acrylic acid homo-polymers and co-polymers as well as anionic compounds having a superior adsorptivity to the nitride film of which surface charge is positive. Preferably, they are one or more compounds selected from the group consisting of poly(acrylic acid), poly(methacrylic acid), poly(ethylene-co-acrylic acid), and poly(ethylene-co-methacrylic acid). It is also preferable to have a molecular weight of 1,000 to 1,250,000 in order for a compound to be dissolved readily in an aqueous solution. If the molecular weight is less than 1,000, the steric hindrance effect is lowered; and if it exceeds 1,250,000, there occurs a problem of bringing about coagulation of polishing particles. It is preferable that the amount of the above carboxylic acid polymer compound to be added is in the range from 0.001 to 5 weight % with respect to the total weight of the aqueous additive comprised of deionized water and the additive. If the amount of addition is less than 0.001 weight %, there are no effects of addition; and if it exceeds 5 weight %, it tends to be that the carboxylic acid polymer compound is not dissolved completely.

Nitrogen-containing organic cyclic compounds assume the role of reducing the speed of polishing of a nitride film and increasing selectivity by improving their adsorption between an acrylic acid compound and nitride film.

Preferable nitrogen-containing organic cyclic compounds in the present invention are one or more compounds selected from the group consisting of 1,3,5-triazine, 1,3,5-triazine-2,4,6-triol(cyanuric acid), 1,3,5-triazine-2,4,6-trichloride(cyanuric chloride), 1,3,5-triazine-2,4,6-trithiol(trithiocyanuric acid), 1,3,5-triazine-2,4,6-trithiol sodium salt, 1,3,5-triazine-2,4,7-trithiol trisodium salt nonahydrate, 3,5,7-triamino-s-triazolo[4,3-a]-s-triazine, 1,3,5-triacryloylhexahydro-1,3,5-triazine, 2,4,6-triaryloxy-1,3,5-triazine, triallyl-1,3,5-triazine-2,4,6-(1H,3H,5H)-trione, 5-azacytidine, 5-azacytosine, 4-amino-1-β-D-arabinofuracyl-1,3,5-triazine-2(1H)-one, cyanuric fluoride, 2-chloro-4,6-dimethoxy-1,3,5-triazine, 2,4,6-triallyloxy-1,3,5-triazime, 2,4,6-triphenyl-1,3,5-triazine, 2-chloro-4,6-diamino-1,3,5-triazine, melamine, 2,4,6-tri(2-pyridyl)-1,3,5-triazine, 2,4,6-tris(1'-aziridinyl)-1,3,5-triazine, 1,2,4-triazine-3,5(2H,4H)-dion(6-azurasyl), 6-aza-2-thymine, 6-aza-2-thiothymine, 6-aza-2-thiouridine, 6-azaurasyl, 3-amino-5,6-dimethyl-1,2,4-triazine, 3-(2-pyridyl)-5,6-diphenyl-1,2,4-triazine, 3-(2-pyridyl)-5,6-bis(5-sulfo-2-furyl)-1,2,4-triazine disodium salt trihydrate, 3-(2-pyridyl)-5,6-diphenyl-1,2,4-triazine p,p'-disulfonic acid monosodium hydrate, and 5,6-di-2-furyl-3-(2-pyridyl)-1,2,4,-triazine. It is preferable that the amount of addition of a nitrogen-containing organic cyclic compound is in the range of 0.001 to 4 weight % with respect to that of the aqueous additive comprised of deionized water and the additive. If the amount of addition is less than 0.001 weight %, there are no effects of addition, and if it exceeds 4 weight %, the speed of polishing of the silicon oxide film is reduced simultaneously and the selectivity is reduced accordingly.

Also, according to the present invention, chemical bonding is established between the silicon oxide film hydrolyzed by deionized water and polishing particles during chemical-mechanical polishing. Then, the hydrolyzed silicon oxide film bound chemically with polishing particles is removed from the surface by the physical force of a polishing pad. The speed of hydrolysis of the upper silicon oxide layer may be improved by adding an amine-group compound, which is an accelerator of hydrolysis, as it is adsorbed to the surface of silicon oxide film. Owing to this, the silicon oxide film is bound to polishing particles readily, which leads to the improvement of the speed of removal of the silicon oxide film.

Preferred amine-group compounds for the present invention are one or more compounds selected from the group consisting of tetramethylammonium hydroxide, tetramethylammonium hydroxide pentahydrate, tetramethyl ammonium fluoride, tetramethylammonium fluoride tetrahydrate, tetramethylammonium chloride, tetramethylammonium bromide, tetramethylammonium iodide, tetramethylammonium nitrate, tetramethyl ammonium sulfate hydrate, tetramethylammonium acetate, tetramethylammonium carbonate, tetramethylammonium formate, tetramethylammonium silicate, tetramethylammonium tetrafluoroborate, tetramethylammonium thioacetate, tetramethylammonium triacetoxyborohydrate, tetramethylammonium borohydride, tetramethylammonium (1-hydroxyethylidine) pentacarbonyl chromium, tetramethyllammonium hexafluorophosphate, tetramethylammonium hydrogen phythalate, and tetramethylammonium hydrogen sulfate. The amount of the above compound to be used is in the range of 0.001 to 3 weight % with respect to the total weight of the aqueous additive. If the amount of addition is less than 0.001 weight %, there are no effects of addition; and if it exceeds 3 weight %, it is difficult to endow selective polishing characteristics since the pH range of 6~8 is deviated if the aqueous additive is used in combination with the aqueous abrasive as the aqueous additive becomes alkaline. Since the pH of the solution thus manufactured assumes a very important role in the dispersion of particles, it is suggested to use hydrochloric acid, sulfuric acid, nitric acid, or a basic solution such as potassium hydroxide, ammonia, etc. in order to adjust the pH additionally.

In the meantime, the above aqueous abrasive and aqueous additive are used in combination with a proper amount of deionized water according to the characteristics of polishing, where 50 to 300 parts by weight of the aqueous additive and 0 to 500 parts by weight of deionized water are used with respect to 100 parts by weight of the aqueous adhesive.

MODE FOR THE INVENTION

The foregoing and other objects, aspects, and advantages will be better understood from the following detailed description of preferred embodiments of the invention.

Preferred Embodiment 1

An aqueous ceria solution is made by mixing 5 weight % of ceria particles having the average particle diameter of 60 nm and 2 weight % of a polyacrylic acid ammonium salt dispersant with deionized water. An aqueous additive solution, in which 1.5 weight % of a polyacrylic acid polymer is added to deionized water, is also made. The pH is adjusted to 7 by adding KOH, which is a pH controlling agent, to the slurry thus manufactured. 300 parts by weight of the aqueous additive and 300 parts by weight of deionized water are mixed with 100 parts by weight of the aqueous ceria solution manufactured before being used. A blanket silicon wafer (6 inches in diameter) having a 1.0-micron silicon oxide film layer coated in the TEOS precursor chemical adsorption method is ground with the mixed slurry by using a Rodel SUVA IV pad in the CMP polishing equipment manufactured by GNP Company. The conditions for polishing are at a falling pressure of 3.5 psi, table speed of 60 rpm, head speed of 60 rpm, temperature of 20° C., slurry flux of 150 cc/min, and for 1 minute. The speed of removal is measured in terms of A of the silicon oxide film removed per minute by measuring the amount of the silicon oxide film removed from the surface of the silicon wafer by CMP with an optical interferometer.

In the meantime, a blanket silicon wafer (6 inches in diameter) having a 0.3-micron silicon nitride film layer coated in the low-pressure chemical adsorption method is ground with the same slurry in the above CMP polishing equipment. The speed of removal is measured in terms of A of the silicon oxide film removed per minute by measuring the amount of the silicon oxide film removed from the surface of the silicon wafer by CMP with an optical interferometer. The speeds of grounding and selectivities of silicon nitride to silicon oxide films are shown in the following Table 1:

Preferred Embodiment 2

An aqueous ceria solution is made by mixing 5 weight % of ceria particles having the average particle diameter of 60 nm and 2 weight % of a polyacrylic acid ammonium salt dispersant with deionized water. An aqueous additive solution, in which 1.5 weight % of a polyacrylic acid polymer is added to deionized water, is also made. 2 weight % of triazine, which is a nitrogen-containing organic cyclic compound, is added. The conditions for mixing and polishing of the aqueous ceria solution and aqueous additive solution thus manufactured are the same as those of Preferred Embodiment 1, and the results are shown in Table 1 below:

Preferred Embodiment 3

An aqueous ceria solution is made by mixing 5 weight % of ceria particles having the average particle diameter of 60 nm and 2 weight % of a polyacrylic acid ammonium salt dispersant with deionized water. To deionized water, 1.5 weight % of a polyacrylic acid polymer, 2 weight % of a triazine compound as a nitrogen-containing organic cyclic compound, 1 weight % of tetramethylammonium hydroxide as an amine-group compound, are added. The pH of the mixture is adjusted to 7 by using hydrochloric acid. The conditions for mixing and polishing of the aqueous ceria solution and aqueous additive solution thus manufactured are the same as those of Preferred Embodiment 1, and the results are shown in Table 1 below:

COMPARATIVE EXAMPLE

An aqueous ceria solution is made by mixing 5 weight % of ceria particles having the average particle diameter of 60 nm and 2 weight % of a polyacrylic acid ammonium salt dispersant with deionized water. The pH is adjusted to 7 by adding KOH, which is a pH controlling agent, into the slurry thus obtained. 600 parts by weight of deionized water is mixed with 100 parts by weight of the aqueous ceria solution manufactured, and ground under the same conditions as those of Preferred Embodiment 1. The results are shown in the following Table 1:

TABLE 1

| Items | Comparative Example | Prefered Embodiment 1 | Prefered Embodiment 2 | Prefered Embodiment 3 |
|---|---|---|---|---|
| Polyacrylic acid (wt %) | — | 1.5 | 1.5 | 2.0 |
| Triazine (wt %) | — | — | 2 | 2 |
| Tetramethylammonium hydroxide (wt %) | — | — | — | 1 |
| Slurry pH | 7 | 7 | 7 | 7 |
| HDP-Oxide layer removal rate (Å/min) | 2200 | 1500 | 1600 | 2100 |
| Silicon nitride layer removal rate (Å/min) | 500 | 60 | 35 | 36 |
| selectivity | 4.4:1 | 25:1 | 46:1 | 58:1 |

It is shown in the above Table 1 that the slurry in Preferred Embodiment 1 in which a polyacrylic acid polymer, which is an additive, has the results of polishing with a removal selectivity improved compared to that of the comparative example. However, it is not possible to obtain a desired selectivity by adding only a polyacrylic acid polymer compound. Moreover, it is shown that the selectivity tends to be low as the speed of removal of silicon oxide film is low, while that of silicon nitride film is high.

In Preferred Embodiment 2, it is possible to reduce the speed of polishing of nitride and to increase the selectivity by adding a nitrogen-containing organic cyclic compound in comparison with Preferred Embodiment 1.

In Preferred Embodiment 3, the speed of hydrolysis of the upper silicon oxide film layer is improved by adding an amine-group compound, which is an accelerator of hydrolysis, to the slurry. Owing to this, the silicon oxide film is bound to polishing particles readily, which leads to the improvement of the speed of removal of the silicon oxide film.

INDUSTRIAL APPLICABILITY

As reviewed in the above, in the chemical-mechanical polishing slurry according to the present invention, a nitrogen-containing compound is used in order to lower the speed of polishing of nitride film that has the greatest affect on the selectivity in the state that a polyacrylic polymer compound is included to increase the removal selectivity. And the removal selectivity of silicon oxide film with respect to that of silicon nitride film is improved significantly by adding an amine-group compound, which is an accelerator of hydrolysis of silicon oxide film.

While the invention has been described in terms of a few preferred embodiments, those skilled in the art will recognize that the invention can be practiced with modification within the spirit and scope of the appended claims.

The invention claimed is:

1. A chemical-mechanical polishing slurry for shallow trench isolation comprising:
an aqueous abrasive solution, which is a mixture of deionized water, polishing particles, and a polishing particle dispersant; and an aqueous additive solution for increasing the removal selectivity, which is comprised of deionized water, 0.001 to 5 weight % of a poly(meth)acrylic acid polymer, 0.001 to 4 weight % of a nitrogen-containing organic cyclic compound, and 0.001 to 3 weight % of an amine-group compound, wherein 100 parts by weight of said aqueous abrasive solution is mixed with 50 to 300 parts by weight of said aqueous additive solution, and wherein said nitrogen-containing organic cyclic compound is one or more compounds selected from the group consisting of 1,3,5-triazine, 1,3,5-triazine-2,4,6-triol(cyanuric acid), 1,3,5-triazine-2,4,6-trichloride(cyanuric chloride), 1,3,5-triazine-2,4,6-trithiol(trithiocyanuric acid), 1,3,5-triazine-2,4,6-trithiol sodium salt, 1,3,5-triazine-2,4,7-trithiol trisodium salt nonahydrate, 3,5,7-triamino-s-triazolo[4,3-a]-s-triazine, 1,3,5-triacryloylhexahydro-1,3,5-triazine, 2,4,6-triaryloxy-1,3,5-triazine, triallyl-1,3,5-triazine-2,4,6-(1H,3H,5H)-trione, 5-azacytidine, 5-azacytosine, 4-amino-1-β-D-arabinofuracyl-1,3,5-triazine-2(1H)-one, cyanuric fluoride, 2-chloro-4,6-dimethoxy-1,3,5-triazine, 2,4,6-triallyloxy-1,3,5-triazime, 2,4,6-triphenyl-1,3,5-triazine, 2-chloro-4,6-diamino-1,3,5-triazine, melamine, 2,4,6-tri(2-pyridyl)-1,3,5-triazine, 2,4,6-tris(1'-aziridinyl)-1,3,5-triazine, 1,2,4-triazine-3,5(2H,4H)-dion(6-azurasyl), 6-aza-2-thymine, 6-aza-2-thiothymine, 6-aza-2-thiouridine, 6-azaurasyl, 3-amino-5,6-dimethyl-1,2,4-triazine, 3-(2-pyridyl )-5,6-diphenyl-1,2,4-triazine, 3-(2-pyridyl)-5,6-bis(5-sulfo-2-furyl)-1,2,4-triazine disodium salt trihydrate, 3-(2-pyridyl )-5,6-diphenyl-1,2,4-triazine p,p'-disulfonic acid monosodium hydrate, and 5,6-di-2-furyl-3-(2-pyridyl)-1,2,4,-triazine.

2. The chemical-mechanical polishing slurry for shallow trench isolation of claim 1, wherein said aqueous abrasive solution comprises deionized water, 0.01 to 30 weight % of said polishing particles, a polishing particle dispersant, and further comprising 0.1 to 10 weight % of a surfactant.

3. The chemical-mechanical polishing slurry for shallow trench isolation of claim 1, wherein said polishing particles are one or more compounds selected from the group consisting of ceria, alumina, silica, and titania.

4. The chemical-mechanical polishing slurry for shallow trench isolation of claim 3, wherein said polishing particles have a size of 0.002 to 10 micrometers.

5. The chemical-mechanical polishing slurry for shallow trench isolation of claim 2, wherein said surfactant is one or more compounds selected from the group consisting of a polyacrylic acid ammonium salt, polymethacrylic acid ammonium salt, polyacrylic acid amine salt, polymethacryric acid amine salt, poly(ethylene-co-acrylic acid) ammonium salt, poly(ethylene-co-acrylic acid) amine salt, poly(ethylene-co-methacrylic acid) ammonium salt, and poly(ethylene-co-methacrylic acid) amine salt.

6. The chemical-mechanical polishing slurry for shallow trench isolation of claim 5, wherein the molecular weight of said surfactant is 1,000 to 1,250,000.

7. The chemical-mechanical polishing slurry for shallow trench isolation of claim 1, wherein said poly(meth)acrylic acid polymer is one or more compounds selected from the group consisting of poly(methacrylic acid), and poly(ethylene-co-methacrylic acid).

8. The chemical-mechanical polishing slurry for shallow trench isolation of claim 1, wherein said amine-group compound is one or more compounds selected from the group consisting of tetramethylammonium hydroxide, tetramethylammonium hydroxide pentahydrate, tetramethyl ammonium fluoride, tetramethylammonium fluoride tetrahydrate, tetramethylammonium chloride, tetramethylammonium bromide, tetramethylammonium iodide, tetramethylammonium nitrate, tetramethyl ammonium sulfate hydrate, tetramethylammonium acetate, tetramethylammonium carbonate, tetramethylammonium formate, tetramethylammonium silicate, tetramethylammonium tetrafluoroborate, tetramethylammonium cyoacetate, tetramethylammonium triacetoxyborohydrate, tetramethylammonium borohydride, tetramethylammonium (1-hydroxyethylidine) pentacarbonyl chromium, tetramethylammonium hexafluorophosphate, tetramethylammonium hydrogen phythalate, and tetramethylammonium hydrogen sulfate.

9. The chemical-mechanical polishing slurry for shallow trench isolation of claim 1, comprising up to 500 parts by weight of said deionized water with respect to the amount of said aqueous abrasive solution.

10. The chemical-mechanical polishing slurry for shallow trench isolation of claim 1, wherein the pH is within the range of 6 to 8.

* * * * *